(12) United States Patent
Glenn

(10) Patent No.: US 8,614,491 B2
(45) Date of Patent: Dec. 24, 2013

(54) PACKAGE INTERFACE PLATE FOR PACKAGE ISOLATION STRUCTURES

(75) Inventor: Max C. Glenn, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 574 days.

(21) Appl. No.: 12/749,687

(22) Filed: Mar. 30, 2010

(65) Prior Publication Data

US 2010/0252899 A1  Oct. 7, 2010

Related U.S. Application Data

(60) Provisional application No. 61/167,500, filed on Apr. 7, 2009.

(51) Int. Cl.
*H01L 29/84* (2006.01)
*B81B 3/00* (2006.01)

(52) U.S. Cl.
USPC ............... 257/415; 257/420; 257/E21.002; 257/E29.324

(58) Field of Classification Search
USPC ........................................ 257/420
See application file for complete search history.

(56) References Cited

U.S. PATENT DOCUMENTS

| | | |
|---|---|---|
| 3,769,562 A | 10/1973 | Bean |
| 4,800,758 A | 1/1989 | Knecht et al. |
| 5,021,864 A | 6/1991 | Kelly et al. |
| 5,587,601 A | 12/1996 | Kurtz |
| 5,783,854 A | 7/1998 | Dries et al. |
| 6,303,985 B1 | 10/2001 | Larson et al. |
| 6,768,196 B2 | 7/2004 | Harney et al. |
| 6,822,318 B2 | 11/2004 | Honer et al. |
| 7,197,939 B2 * | 4/2007 | Sakai et al. ............ 73/754 |
| 7,475,597 B2 | 1/2009 | Brida et al. |
| 7,661,318 B2 | 2/2010 | Brosh et al. |
| 2001/0001550 A1 * | 5/2001 | Bryzek et al. ............ 338/36 |
| 2007/0090475 A1 * | 4/2007 | Karnick et al. ............ 257/415 |
| 2007/0108566 A1 | 5/2007 | Trasporto et al. |

* cited by examiner

*Primary Examiner* — Fernando L Toledo
*Assistant Examiner* — Valerie N Newton
(74) *Attorney, Agent, or Firm* — Fogg & Powers LLC

(57) ABSTRACT

A package assembly comprises a package base, a sensor die, an isolation plate, and a package interface plate. The isolation plate is bonded to the sensor die and has a plurality of flexible beams. Each flexible beam is configured to deflect under stress such that effects on the sensor die of a thermal mismatch between the package base and the sensor die are reduced. The package interface plate is bonded to the isolation plate and the package base. The package interface plate is configured to limit the maximum distance each flexible beam is able to deflect.

14 Claims, 5 Drawing Sheets

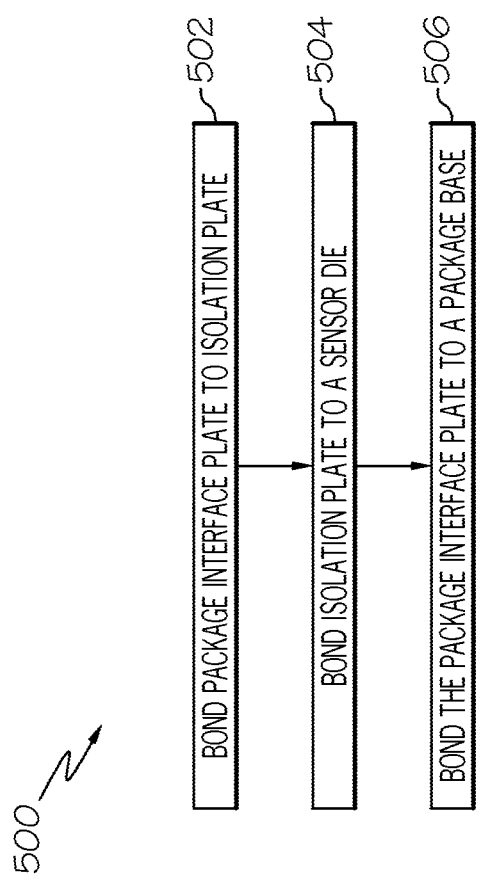

PACKAGE INTERFACE PLATE FOR PACKAGE ISOLATION STRUCTURES

CROSS-REFERENCE TO RELATED APPLICATIONS

This application is related to U.S. provisional patent application Ser. No. 61/167,500 entitled "PACKAGE INTERFACE PLATE FOR MEMS PACKAGE ISOLATION STRUCTURES," filed on Apr. 7, 2009 and referred to herein as the '500 application. The present application hereby claims priority to U.S. Provisional Patent Application No. 61/167,500. The '500 application is hereby incorporated herein by reference.

BACKGROUND

Some integrated circuit (IC) package assemblies include a package base and a die, such as a sensor die, bonded to the package assembly. If there is a thermal expansion mismatch between the sensor die and the package base, isolation structures can be included between the sensor die and the package base to mitigate the effects of the thermal expansion mismatch.

SUMMARY

In one embodiment, a package assembly is provided. The package assembly comprises a package base, a sensor die, an isolation plate, and a package interface plate. The isolation plate is bonded to the sensor die and has a plurality of flexible beams. Each flexible beam is configured to deflect under stress such that effects on the sensor die of a thermal mismatch between the package base and the sensor die are reduced. The package interface plate is bonded to the isolation plate and the package base. The package interface plate is configured to limit the maximum distance each flexible beam is able to deflect.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 5 is flow chart depicting one embodiment of a method of manufacturing a package assembly.

Figure 1:
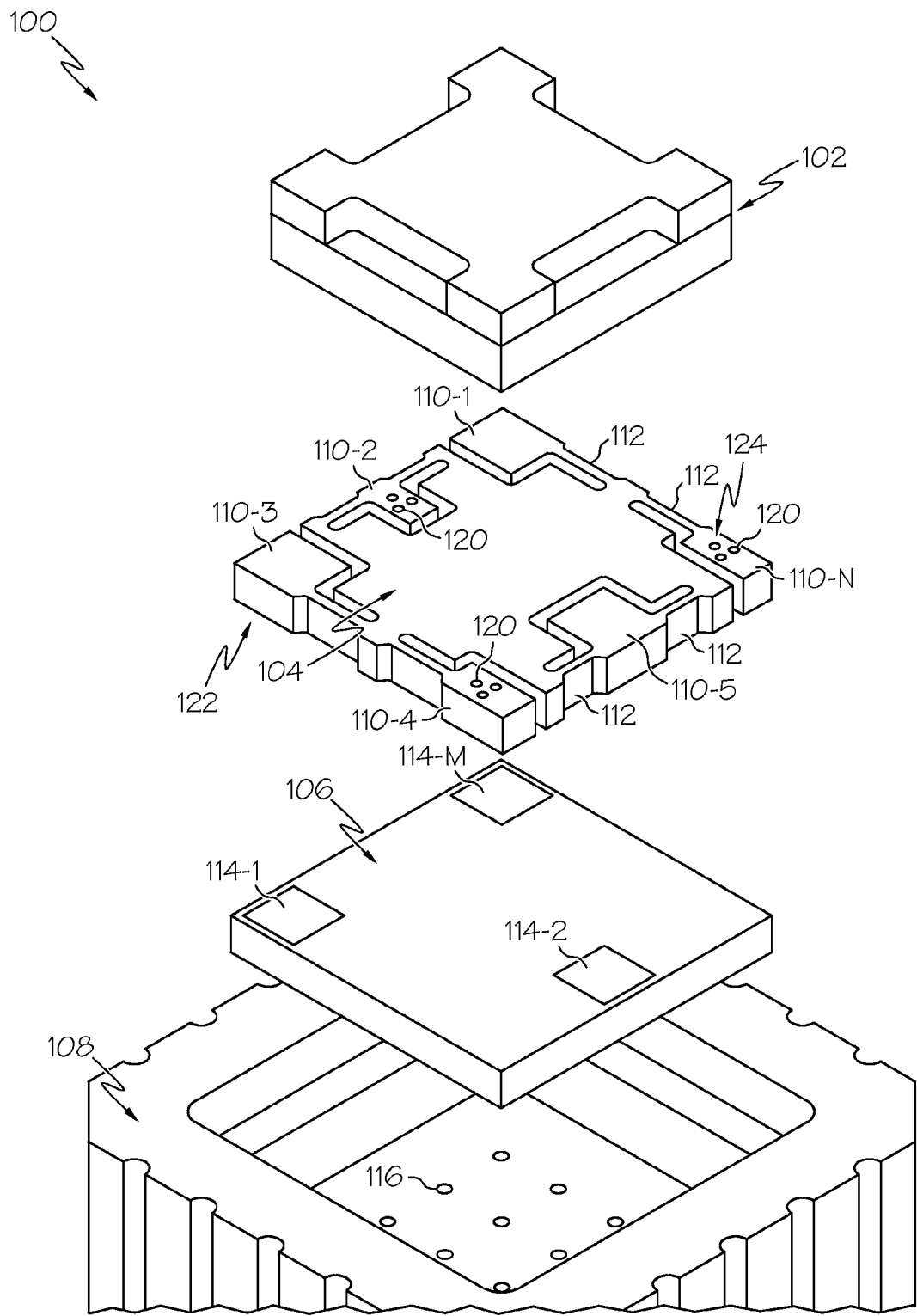
FIG. 1 is an exploded perspective view of an exemplary package assembly having one embodiment of a package interface plate.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be taken in a limiting sense.

FIG. 1 is an exploded perspective view of an exemplary package assembly 100 having one embodiment of a package interface plate (PIP) 106. The package assembly 100 also includes a sensor die 102, an isolation structure 104, and package base 108. The package assembly 100 is implemented as a Microelectromechanical system (MEMS) in this embodiment. Additionally, in this exemplary embodiment, the package base 108 is implemented as a Leadless Chip Carrier (LCC) package. The sensor die 102 is implemented as a sensor to provide measurements of interest for the particular application in which the package assembly 108 is used. For example, in this embodiment, the sensor die 102 is implemented as an inertial sensor die to provide motion measurements. However, it is to be understood that, in other embodiments, other package bases and/or sensor dies are used.

The exemplary isolation structure 104 (also referred to herein as an isolation plate) includes a plurality of paddles 110-1 ... 110-N and a plurality of beams 112. The plurality of paddles 110-1 ... 110-N are used to bond the isolation plate 104 to the sensor die 102 and the PIP 106. For example, in this exemplary embodiment, paddles 110-1, 110-3, and 110-5 are bonded to PIP 106 and paddles 110-2, 110-4 and 110-N are bonded to sensor die 102. In particular, the PIP 106 includes a plurality of raised pedestals 114-1 ... 114-M which correspond to the location of at least one of the paddles 110 in the isolation plate 104. For example, in this embodiment, the PIP 106 includes three pedestals 114 which correspond to the location of paddles 110-1, 110-3, and 110-5.

Thus, in this example, a first surface 122 (on the underside of isolation plate 104 in FIG. 1) of paddles 110-1, 110-3, and 110-5 are bonded to the corresponding pedestals 114-1 ... 114-M. A second surface 124 (on the topside of isolation plate 104 in FIG. 1) of paddles 110-2, 110-4, and 110-N are bonded to the sensor die 102. In other embodiments, the first surface 122 of each of paddles 110-1 ... 110-N are bonded to a corresponding pedestal 114 of the PIP 106 and the second surface 124 of each of paddles 110-1 ... 110-N are bonded to the sensor die.

In this exemplary embodiment, the bond between the pedestals 114 and the paddles 110-1, 110-3, and 110-5 are anodic bonds performed at the wafer level. In other words, a wafer comprising a plurality of isolation structures is anodically bonded to a wafer containing a corresponding plurality of package interface plates. After bonding the wafer, individual isolation plate/pip stacks are cut from the bonded wafers.

Bonding the PIP 106 and the isolation plate 104 at the wafer level, enables the use of non-macro bonding techniques, such as anodic bonding which forms a chemical bond. For example, in some embodiments, the PIP 106 is comprised of glass and the isolation plate 104 is comprised of silicon. Hence, in some such embodiments, techniques known to one of skill in the art for glass to silicon anodic bonding are used. In other embodiments, the PIP 106 and the isolation plate 104 are both comprised of silicon. In some such embodiments, silicon-to-silicon anodic bonding techniques known to one of skill in the art, such as depositing glass films on the silicon package interface plate, are used. In other embodiments, other non-macro bonding techniques known to one of skill in the art are used, such as silicon fusion bonding. As compared to macro bonding techniques, the use of non-macro bonding techniques helps reduce stress placed on the plurality of beams 112 in the isolation plate 104 during the bonding process.

Furthermore, in some embodiments, the sensor die 102 is also bonded to the isolation plate 104 at the wafer level using non-macro bonding techniques. In other embodiments, a macro bonding technique, such as epoxy, gold bumps, or solder, is used to bond the sensor die 102 to the isolation plate 104 after the corresponding wafers have been separated into individual sensor dies and isolation plates. For example, in the exemplary embodiment of FIG. 1, gold bumps 120 are used on paddles 110-2, 110-4, and 110-N to bond the isolation plate 104 to the sensor die 102.

Although six paddles 110 are shown in the exemplary isolation plate 104 in FIG. 1, it is to be understood that, in other embodiments, different numbers of paddles 110 are used. In addition, although paddles 110-1, 110-3, and 110-5 are larger than paddles 110-2, 110-4 and 110-N in this example, paddles 110-1 . . . 110-N are configured differently in other embodiments. For example, in some embodiments, each of paddles 110-1 . . . 110-N are substantially the same size. In addition, in some embodiments, each of paddles 110-1 . . . 110-N are bonded to both the sensor die 102 and the PIP 106.

The isolation plate 104 provides mechanical and thermal isolation of the sensor die 102 from the package base 108. In particular, there is a thermal expansion mismatch between the sensor die 102 and the package base 108. If the sensor die 102 were bonded directly to the package base, the sensor die 102 would bend with changes in temperature due to the thermal mismatch. The isolation plate 104, therefore, reduces the bending of the sensor die 102. In particular, the flexible beams 112 of the isolation plate 104 bend under stress rather than the sensor die 102.

The PIP 106 is bonded to the package base 108 using a macro-bonding technique. For example, in this embodiment, an array of gold bonds 116 is used to bond the PIP 106 to the package base 108. As stated above, the PIP 106 reduces stresses placed on the beams 112 of the isolation plate 104 during the bonding process. In particular, the pedestals 114 each have a height which enables the beams 112 to bend and, thus, reduce the effects of a thermal expansion mismatch on the sensor die 102. However, the height of the pedestals 114 is configured so that the amount of deflection or bending of the beams 112 is limited. For example, if the beams 112 are likely to break after being deflected beyond a certain level of deflection, referred to herein as the break distance, the height of the pedestals 114 is set below the break distance.

Setting the height of the pedestals 114 below the break distance causes the beams 112 to make contact with the surface of the PIP 106 prior to reaching the break distance. The beams 112 are, thus, less likely to break. For example, if the break distance is determined to be 20 microns, the height of the pedestals 114 can be set at 3-4 microns to prevent the beams 112 from being deflected above the break distance of 20 microns. In addition, the height of the pedestals 114 is larger than an expected amount of deflection due to the thermal expansion mismatch so as to not hinder the isolation function of the isolation plate 104.

Figure 2:
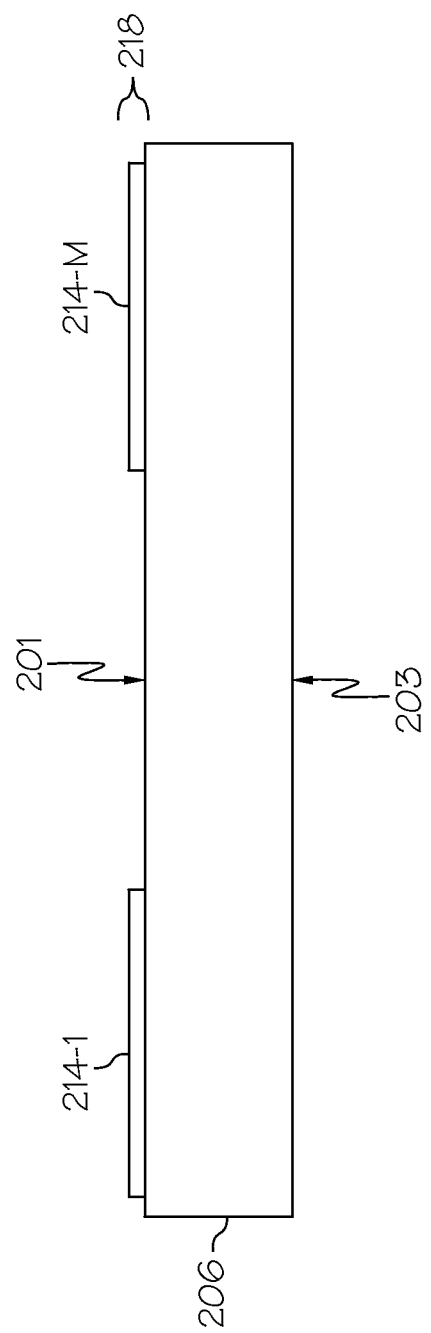
FIG. 2 is cross-sectional view of one embodiment of a package interface plate.

FIG. 2 is a cross-sectional view of an exemplary embodiment of a package interface plate 206. As shown in FIG. 2, the pedestals 214 located on a first surface 201 of the PIP 206 have a height 218. For example, in this embodiment, the height 218 is approximately 4 microns. The height 218 can be determined, for example, based on empirical evidence indicating a maximum distance the beams of the isolation plate can bend without breaking. Alternatively, the height 218 can be determined through modeling. Thus, the height 218 is selected to be less than the maximum distance the beams can bend or deflect. The pedestals 214 can be formed in the first surface 201 by etching the first surface 201. In this way, the height 218 of the pedestals 214 can be controlled.

Thus, when the paddles of the isolation plate are bonded to the pedestals 214, a gap is formed between the first surface 201 and the isolation plate. The distance between the first surface 201 and the isolation plate is defined by the height 218 of the pedestals 214. As stated above, the height 218 is configured to prevent the beams of an isolation plate from deflecting beyond a level which could cause the beams to break. Hence, as the beams deflect, they will come into contact with the first surface 201 of the PIP 206 after deflecting a distance equal to the height 218 of the pedestals 214. The first surface 214 then prevents the beams from deflecting further.

If the isolation plate were bonded directly to the package base using macro bonding techniques, the beams of the isolation plate may deflect to such an extent that they break, thus rendering the isolation plate ineffective in mitigating the effects of the thermal expansion mismatch between the package base and the sensor die. However, as shown in FIG. 2, a second surface 203 of the package interface plate 206, opposite to the first surface 201, is substantially flat. Since the second surface 203 is substantially flat, the package interface plate 206 can be handled like a typical die and enable macro bonding techniques to bond the PIP 206 to a package base without negatively affecting the beams of the isolation plate.

Figure 3:
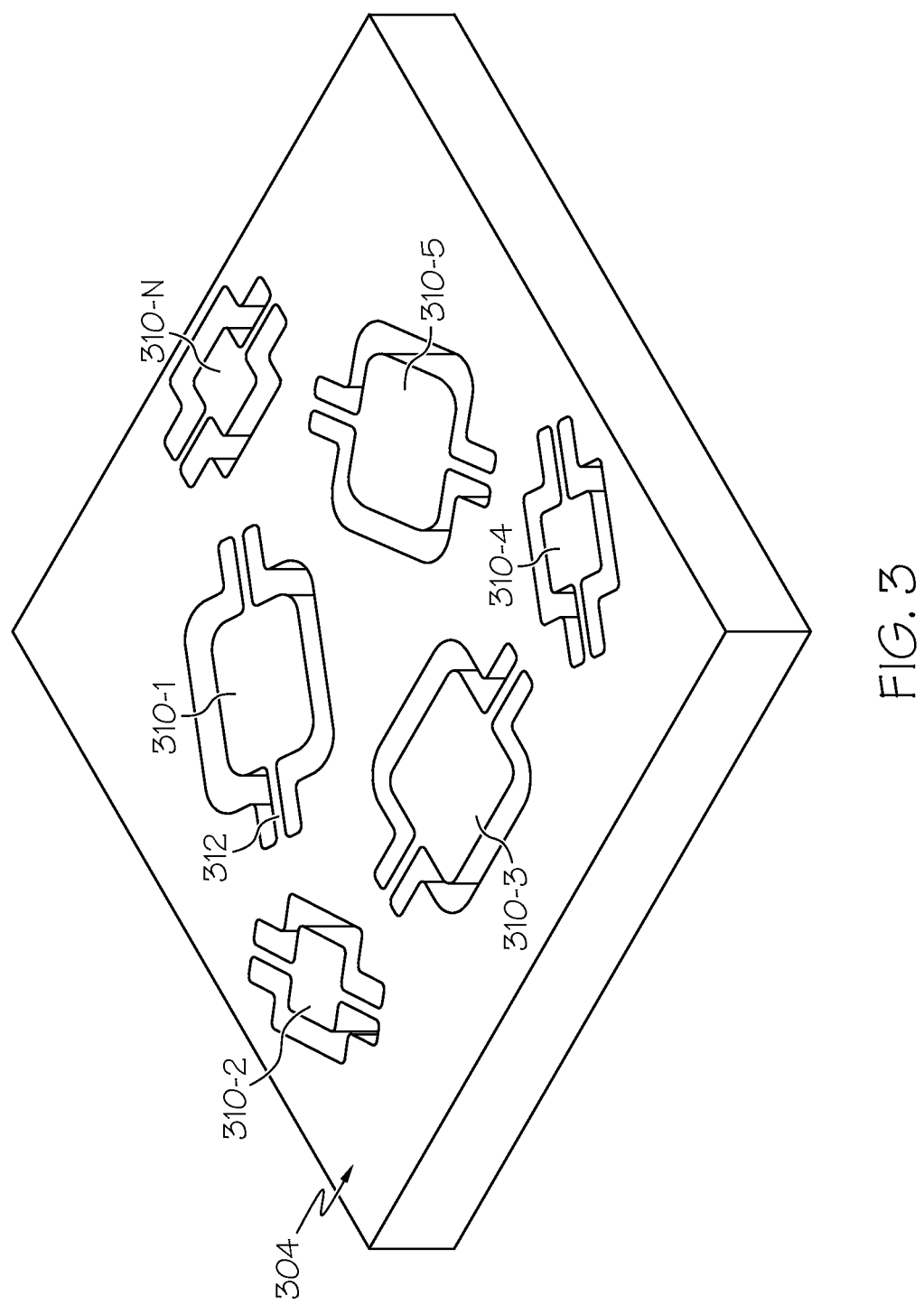
FIG. 3 is a perspective view of one embodiment of an isolation plate.

FIG. 3 is a perspective view of another exemplary isolation plate 304. Isolation plate 304 is similar to isolation plate 104 discussed above. However, the paddles 310-1 . . . 310-N are configured differently. In particular, in this example, the paddles 310-1, 310-3, and 310-5 are located near the center of the isolation plate 304, whereas the paddles 310-2, 310-4, and 310-N are located near the perimeter of the isolation plate 304.

Figure 4:
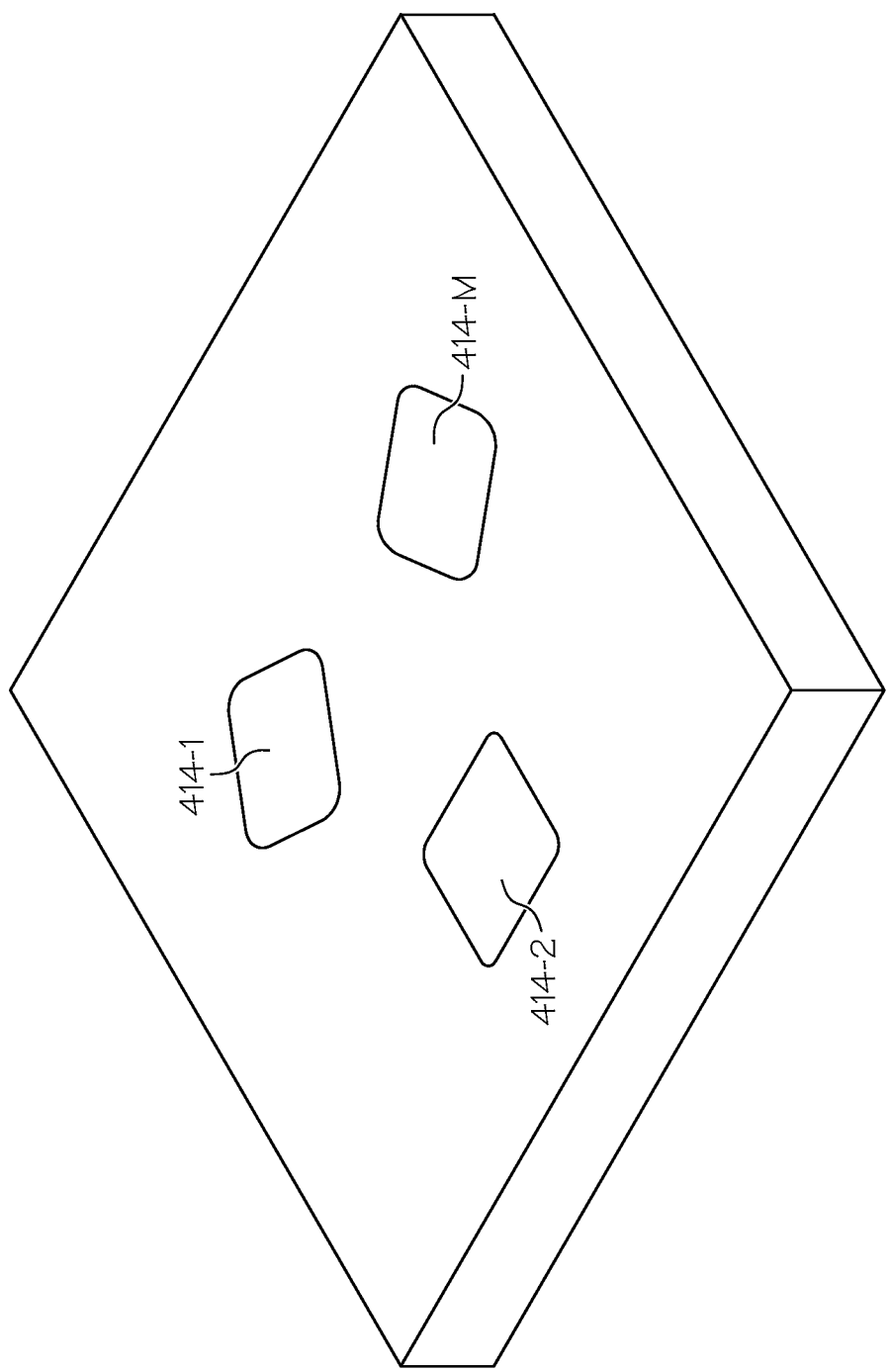
FIG. 4 is a perspective view of another embodiment of a package interface plate.

FIG. 4 is a perspective view of a package interface plate 406 which corresponds to the exemplary isolation plate 304 in FIG. 3. As can be seen in FIG. 4, the pedestals 414 are located in positions corresponding to the location of the paddles 310-1, 310-3, and 310-5 in the isolation plate 304. Thus, it is to be understood that various configurations of the isolation plate and package interface plate can be used in different embodiments.

FIG. 5 is a flow chart depicting one embodiment of a method 500 of manufacturing a package assembly such as package assembly 100 described above. At block 502, a package interface plate is bonded to an isolation plate. In particular, at least one pedestal on a first surface of the package interface plate is bonded to a first surface of a respective paddle in the isolation plate to form a gap between the first surface of the package interface plate and the isolation plate. The gap is defined by the height of the pedestal on the first surface of the package interface plate. In some embodiments, the at least one pedestal is bonded to a respective one of the plurality of paddles at the wafer level. In addition, in some embodiments, the at least one pedestal is anodically bonded to the respective paddles. In other embodiments, other non-macro bonding techniques are used, such as silicon fusion.

At block 504, a second surface of at least one paddle in the isolation plate is bonded to a sensor die. In particular, the isolation plate has a plurality of paddles. In some embodiments, the one or more paddles bonded to the sensor die are different from the one or more paddles bonded to the respective at least one pedestal. In some embodiments, the sensor die is bonded to the at least one paddle at the wafer level. In other embodiments, the sensor die is bonded to the at least one paddle after the wafer has been divided into individual sensor dies. In addition, in some embodiments, a macro bonding technique, such as gold bumps, is used to bond the sensor die to the at least one paddle of the isolation plate.

At block 506, a second surface of the package interface plate is bonded to a package base. In particular, in this embodiment, an array of gold bumps is used to bond the package interface plate to the package base. In other embodiments, other macro bonding techniques, such as epoxy or solder, are used. It is to be understood that the acts performed at blocks 502-506 are not limited to the order in which they are described herein. For example, in some embodiments, the package interface plate is bonded to the package base prior to bonding the sensor die to the at least one paddle of the isolation plate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A package assembly comprising:
   a package base;
   a sensor die;
   an isolation plate bonded to the sensor die, the isolation plate having a plurality of flexible beams, each flexible beam configured to deflect under stress such that effects on the sensor die of a thermal mismatch between the package base and the sensor die are reduced; and
   a package interface plate bonded to the isolation plate and the package base, wherein the package interface plate is configured to limit the maximum distance each flexible beam is able to deflect;
   wherein the isolation plate further comprises a plurality of paddles; the plurality of flexible beams coupled to the plurality of paddles.

2. The package assembly of claim 1, wherein the package interface plate is configured to limit the deflection of each flexible beam such that the maximum distance each flexible beam is deflected is approximately 4 microns.

3. The package assembly of claim 1, wherein package interface plate is comprised of one of a glass substrate or a silicon substrate.

4. The package assembly of claim 1, wherein the package interface plate is anodically bonded to the isolation plate.

5. The package assembly of claim 1, wherein the package interface plate is bonded to the package base with one of epoxy, solder or gold bumps.

6. The package assembly of claim 1, wherein the sensor die is an inertial sensor die.

7. A package assembly comprising:
   an isolation plate comprising:
      a plurality of paddles; and
      a plurality of flexible beams coupled to the plurality of paddles, wherein each flexible beam is configured to deflect under stress; and
   a package interface plate comprising:
      a first surface having a plurality of pedestals located thereon, each pedestal having a predetermined height, wherein the location of each pedestal on the first surface corresponds to a location of a respective one of the plurality of paddles in the isolation plate; and
      a second surface configured to be bonded to a package base;
   wherein each of the plurality of pedestals on the first surface of the package interface plate is bonded to a respective one of the plurality of paddles in the isolation plate; and
   wherein the maximum distance each flexible beam is able to deflect is limited by the height of the plurality of pedestals.

8. The package assembly of claim 7, wherein the predetermined height of each pedestal is approximately 4 microns.

9. The package assembly of claim 7, wherein the package interface plate is comprised of one of a glass substrate and a silicon substrate.

10. The package assembly of claim 7, wherein each of the plurality of pedestals is anodically bonded to one of the plurality of paddles.

11. The package assembly of claim 7, wherein each of the plurality of pedestals is bonded to one of the plurality of paddles at a wafer level.

12. The package assembly of claim 7, further comprising:
   an inertial sensor die, wherein each paddle of a first subset of the plurality of paddles is bonded to one of the plurality of pedestals and each paddle of a second subset of the plurality of paddles is bonded to the inertial sensor die.

13. The package assembly of claim 12, wherein the paddles of the first subset are larger than the paddles of the second subset.

14. The package assembly of claim 1, wherein the package interface plate comprises a plurality of pedestals on a first surface of the package interface plate, each of the plurality of pedestals on the first surface of the package interface plate bonded to a respective one of the plurality of paddles in the isolation plate.

* * * * *